United States Patent [19]

Komoto

[11] Patent Number: 4,511,883
[45] Date of Patent: Apr. 16, 1985

[54] A-D CONVERTER FOR USE IN AN ELECTRONIC BALANCE
[75] Inventor: Akira Komoto, Otsu, Japan
[73] Assignee: Shimadzu Corporation, Kyoto, Japan
[21] Appl. No.: 402,582
[22] Filed: Jul. 28, 1982
[30] Foreign Application Priority Data Jul. 31, 1981 [JP] Japan ................. 56-121294

[51] Int. Cl.³ ............................. H03K 13/02
[52] U.S. Cl. ..................... 340/347 AD; 340/347 M; 340/347 NT; 364/832
[58] Field of Search ............... 340/347 AD, 347 NT, 340/347 CC; 364/832; 324/76 A

[56] References Cited
U.S. PATENT DOCUMENTS 3,581,304  5/1971  Paradise et al. ............. 340/347 AD
4,196,419  4/1980  Brown ......................... 340/347 AD
4,315,254  2/1982  Honjyo et al. ............. 340/347 AD X

OTHER PUBLICATIONS

Schmid, Electronic Analog/Digital Conversions, Van Nostrand Reinhold Co., 1970, pp. 206–209.
Yokoi, Linear IC Jitsuyo Kairo Manual, Rajio (Radio) Gijutsusha, pp. 327 (line 7) to 328 (line 1), cited and translated by applicant.

Primary Examiner—T. J. Sloyan
Attorney, Agent, or Firm—Koda and Androlia

[57] ABSTRACT

An A-D converter for use in an electronic balance including an A-D converting unit, a pulse-modulating D-A converting unit, a digital memory, a digital adder, an analog subtracter and means for generating a signal whose level corresponds to an integral multiple of the overflow level of said A-D converting unit. The converter has a distinct feature in its rapid response to the input signal variations within a predetermined range in spite of high-resolving and large converting capacity.

2 Claims, 5 Drawing Figures

A-D CONVERTER FOR USE IN AN ELECTRONIC BALANCE

BACKGROUND OF THE INVENTION

1. Field of the Invention

The present invention relates to an A-D converter for use in an electronic balance.

2. Prior Art

A conventional high precision electronic balance takes a fairly long time to complete one measurement of weight, because of a slow response of the high-resolving A-D converter which is necessarily used in an electronic balance. In general, the longer the response time of an A-D converter becomes, the higher is its resolving power and the larger is its converting capacity. Such being the case, it takes a very long time, especially when it is necessary for the balance to average a number of sampled weight values due to a noisy condition of weighing an object to be measured. Certainly, there is known a high-resolving and high-speed A-D converter in which a D-A converter of a weighted-resistance type is incorporated. However, such an A-D converter has a disadvantage that the D-A converter incorporated therein, which requires many high-precision resistors, is temperature-sensitive, and therefore, liable to be unstable unless provided with a special temperature controlling means. Fine adjustment and preparation of the precision resistors are also troublesome.

SUMMARY OF THE INVENTION

Accordingly, the present invention aims at eliminating the disadvantages and difficulties mentioned above with respect to the prior art, and it is an object of the invention to provide an improved high-resolving and high-speed A-D converter for use in an electronic balance.

Another object of the invention is to provide an improved A-D converter for use in an electronic balance, the A-D converter showing a rapid response to the input signal variations in a predetermined range in spite of being high-resolving and large in converting capacity.

Other objects and advantages of the present invention will become apparent from the detailed description of the invention given hereinafter with reference to embodiments. It should be, however, understood that there are many other changes and modifications which the persons skilled in the art can easily make within the spirit of the present invention, since the embodiments are given by way of examples only.

According to the present invention an improved A-D converter includes an analog signal subtracter, an A-D converting unit which is of relatively small converting capacity but high-resolving power, a digital memory, a digital adder and a pulse-modulating D-A converting unit. The digital memory utilized is able to store and output a signal corresponding to an integral multiple of the overflow level of the A-D converting unit. In case a signal to be measured, which is supplied to the A-D converting unit through the analog subtracter, is so large that it overflows the A-D converting unit, an integral multiple of the overflow level of the A-D converting unit is subtracted from the input by the subtracter to make the A-D converting unit free from being overflowed. This signal to be subtracted at the subtracter is supplied from the digital memory after being converted to an analog signal by the pulse-modulating D-A converting unit. In the meanwhile, the same signal as is supplied to the D-A converting unit is also inputted to the digital adder, which adds the signal to the non-overflowing output from the A-D converting unit to give a measured output signal.

The A-D converter based on the invention, as is understood from the brief description given above, rapidly responds to the input signal variations within the full input range of the incorporated A-D converting unit, since it is high-resolving but of small converting capacity. It is, therefore, apparent that the present invention may be effectively employed in an electronic balance, especially in a precision one which has a weight averaging means.

DETAILED DESCRIPTION OF THE INVENTION

Figure 1:
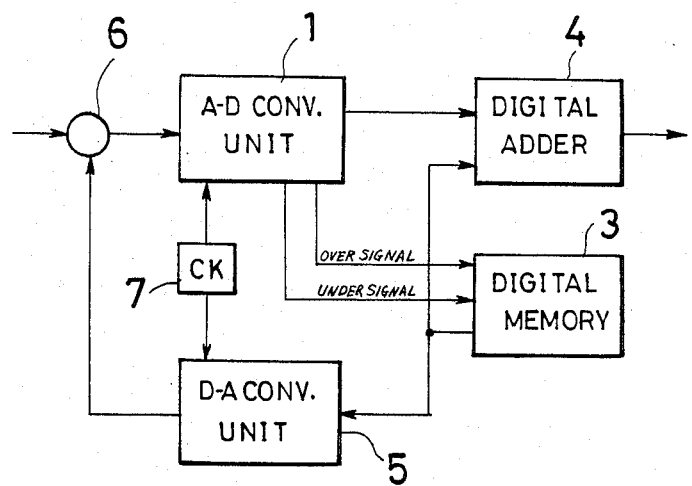
FIG. 1 is a block diagram showing an embodiment of an A-D converter of the present invention.
Figure 2:
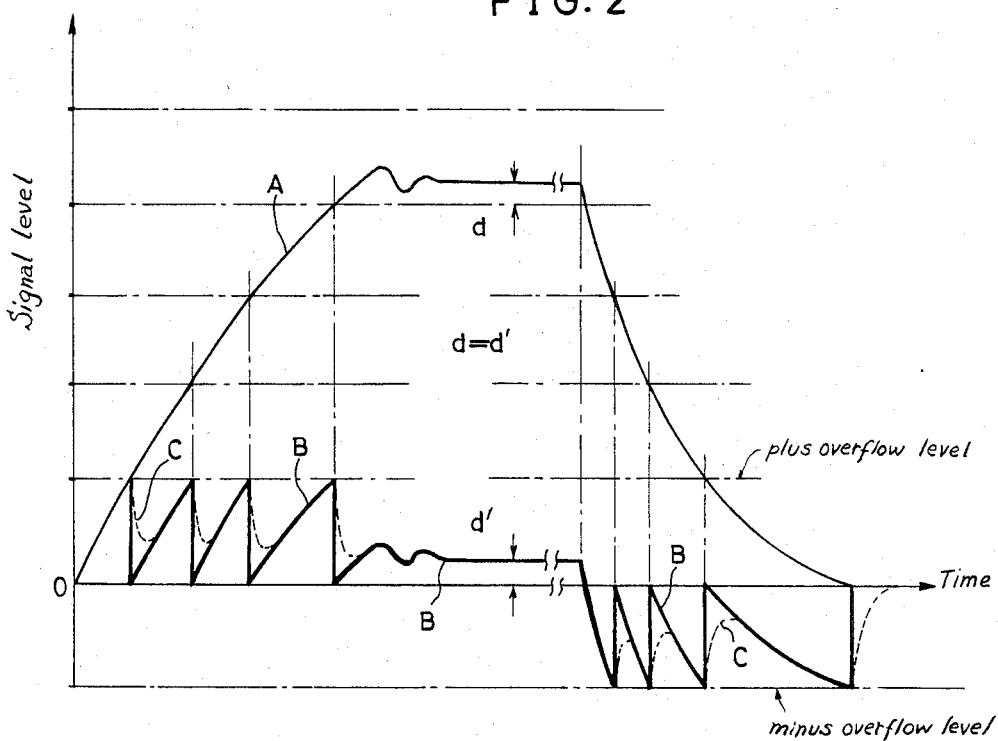
FIG. 2 is a graphic illustration of the output (or input) signal of the A-D converting unit appearing in FIG. 1.

Referring to FIG. 1, an embodiment of the present invention comprises an A-D converting unit 1, a digital adder 4, a digital memory 3, a pulse-width modulating D-A converting unit 5, an analog subtracter 6 and a clock generator 7 which commonly drives both the A-D converting unit 1 and the D-A converting unit 5. In such construction of the embodiment an input analog signal to be measured is supplied to the A-D converting unit 1 through the analog subtracter 6. If the level of the input signal to be measured is so low that it does not overflow the A-D converting unit 1, the signal passes through the analog subtracter 6 without any value subtracted from it, and then reaches the A-D converting unit 1, which converts it to a digital signal. The digitalized signal passes through the digital adder 4 without any value added, and is outputted therefrom as a measured signal. In case, however, the input level is so high that the A-D converting unit is overflowed, the A-D converting unit generates an oversignal and inputs it to the digital memory 3. On receiving the oversignal the digital memory 3 outputs a digital signal which corresponds to the overflow level of the A-D converting unit 1 both to the pulse-modulating D-A converting unit 5 and to the digital adder 4. The signal inputted to the D-A converting unit 5 is converted to an analog signal, and sent to the subtracter 6 which subtracts it from the signal to be measured. If the signal from which one overflow level of the A-D converting unit 1 was thus subtracted does not overflow the A-D converting unit 1, the output of the A-D converting unit 1 is sent to the adder 4, where the signal corresponding to one overflow level of the A-D converting unit 1 is added to it. The non-overflowing signal from the A-D converter plus the overflow level makes a total output. Unless the A-D converting unit 1 is still overflowed or saturated after one such process of signal subtraction, the subtraction process is repeated until the A-D converting unit 1 outputs a non-overflowing signal. On the other hand, when an already inputted large signal is decreased to a level which turns the output of the A-D converting unit 1 to the minus overflow level, the A-D converting unit 1 outputs an undersignal to the digital memory 3. The memory 3, on receiving the undersignal, outputs a digital signal one step lower than that having been outputted hitherto, that is, a signal whose level is decreased by the amount corresponding to one overflow level of the A-D converting unit 1. The signal level to be subtracted at the subtracter 6 is thus reduced to make the A-D converting unit 1 produce a non-overflowing minus output. Unless the A-D converting unit 1 is made to produce such an output again by one process of reducing the signal level to be subtracted, the process is automatically repeated until the A-D converting unit comes to produce a non-overflowing output. The output (or input) signal of the A-D converting unit 1 is graphically illustrated in FIG. 2 in conjunction with the total input to the above embodied A-D converter which includes the A-D converting unit 1. In the figure a curve A, a curve B and a curve C (dotted line) show a total input to the A-D converter, an ideal output (or input) of the A-D converter and a practical signal of the same. The difference between the ideal curve B and the practical one C is due to the response time of the D-A converting unit 5.

For the A-D converting unit 1 in the embodiment any of the commercially available A-D converting circuits such as 8052A/7103A, ICL7104 of Intersil and LD1200/LD121A of Silconix may well be employed. The details of the pulse modulating D-A converting unit, which which is known in the prior art but does not seem to be available commercially, are disclosed, for instance, in an article written by Yojiro Yokoi and published from Rajio (Radio) Gijutsusha in Japan under the title of "Linear IC Jitsuyo Kairo Manual". In this article is described a D-A converter which is made employing a counter and a decoder which is made of BCD code digital switches. The output signal of the D-A converter is further filtered by a low pass filter.

The D-A converting unit of the pulse modulating type shows a high precision performance in spite of being easily assembled, though the response time is somewhat long. The long response time is not unfavorable in the present case, because the D-A converting unit is used for generating the subtraction signal which, in case of an electronic balance, does not vary so frequently. The high precision performance is of essential importance.

Figure 3:
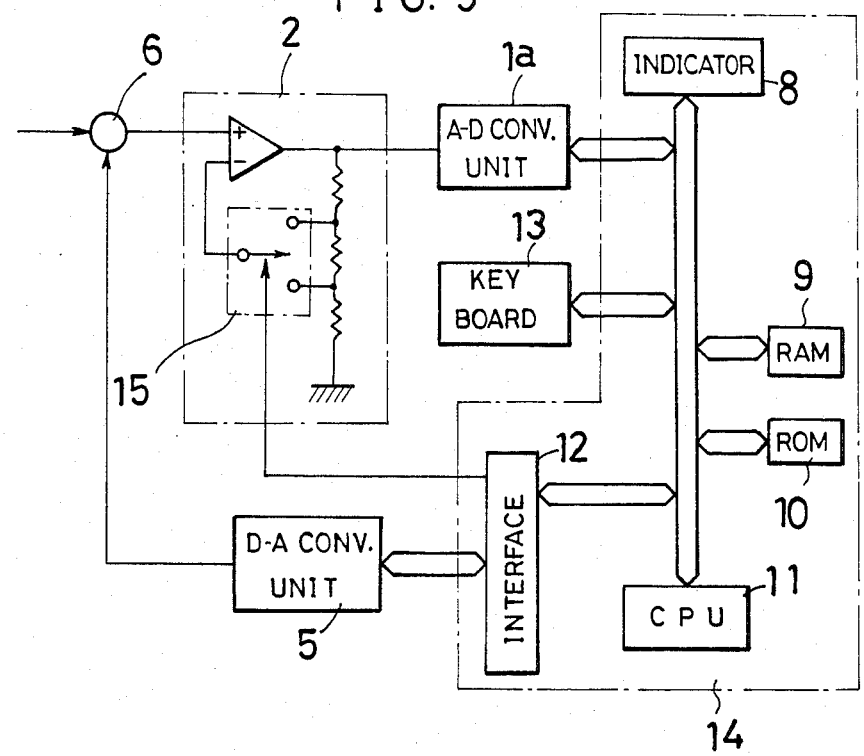
FIG. 3 is a block diagram showing another embodiment of the present invention.
Figure 4:
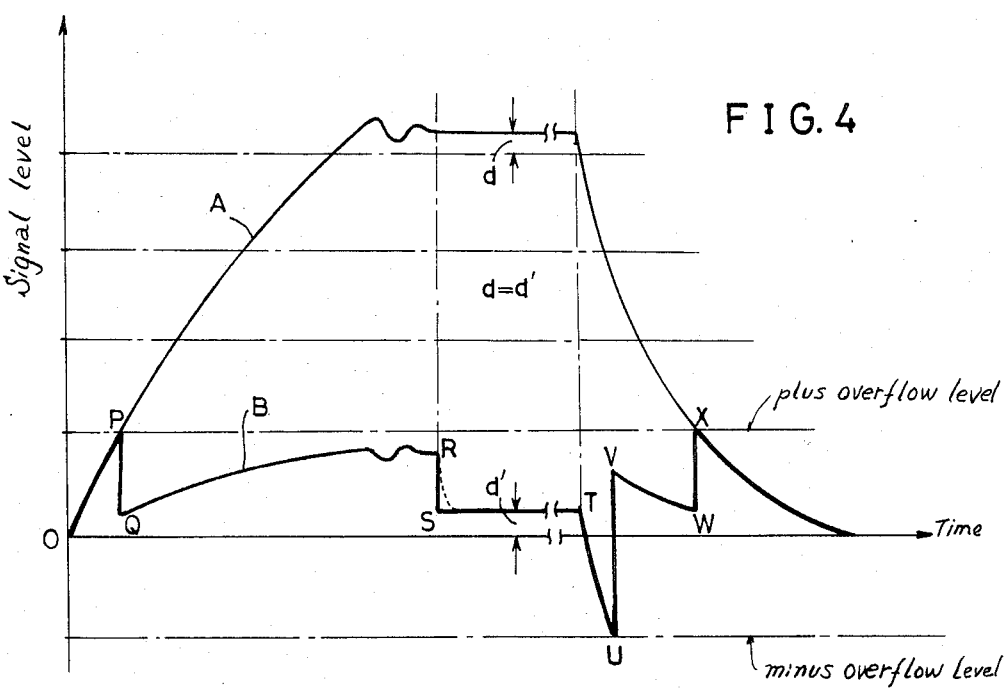
FIG. 4 is a graphic illustration of the output (or input) signal of the A-D converting unit appearing in FIG. 3.
Figure 5:
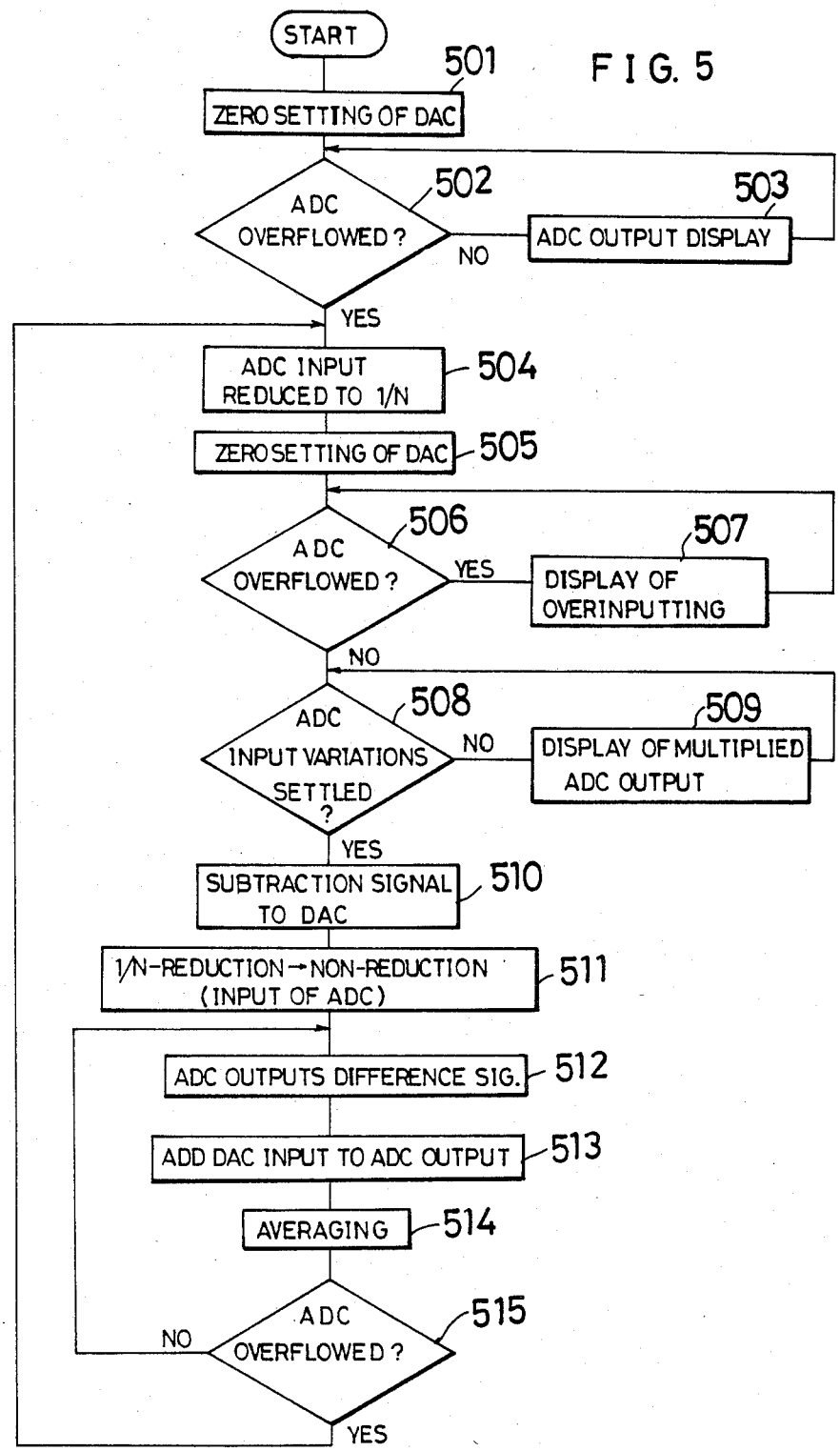
FIG. 5 is a flow chart of the program stored in the ROM incorporated in the embodiment of FIG. 3.

In the following, another embodiment of the present invention is described with reference to FIGS. 3, 4 and 5. In FIG. 3 which shows a blocks diagram of the embodiment, there is provided a signal reducer 2 between an analog subtracter 6 and an A-D converting unit 1a. The signal reducer 2 can reduce the output signal of the A-D converting unit 1a to 1/N and is provided with a selection switch 15 by which either a 1/N-reduced or non-reduced signal is selectively outputted. The A-D converting unit 1a and the input of the pulse-width modulating D-A converting unit 5 are connected with a microcomputer 14 which comprises a CPU 11, ROM 10, RAM 9, interface 12 and indicator 8. The selection switch also is operated by the signal from the microcomputer. In describing the function of this embodiment FIG. 4 is also referred to. In FIG. 4 a curve A means the signal to be measured, and a curve B shows the input (or output) of the A-D converting unit 1a.

Initially the input and output of the D-A converting unit 5 are set to zero, and the selection switch 15 of the signal reducer 2 is set so that the signal reducer 2 may output a non-reduced signal. Therefore, the signal to be measured being inputted, the A-D converting unit 1a outputs a digitalized signal along the curve A in FIG. 4 until the output rises up to Point P which corresponds to the overflow level of the A-D converting unit 1a. When the output of the A-D converting unit 1a reaching the overflow level, the signal reducer 2 reduces the input signal of the A-D converting unit 1a to 1/N with the selection switch 15 operated by the signal from the microcomputer 14. The part between Q and R on the curve B corresponds to the 1/N-reduced input and, therefore, the output of the A-D converting unit 1a. During this period the indicator 8 of the microcomputer 14 displays an approximated value of the measured signal. When the output signal variation of the A-D converting unit 1a settles down (Point R), the microcomputer 14 outputs to the D-A converting unit 5 a signal which corresponds to an integral multiple of the overflow signal of the A-D converting unit 1a, the multiplication factor being dependent on the value N. On receiving the signal the D-A converting unit 5 outputs an analog signal to be subtracted from the input to be measured. At the same time the output of the signal reducer 2 is changed to the non-reduced signal with the selection switch 15 operated also by the signal from the microcomputer 14. The part between S and T on the curve B shows that the A-D converting unit 1a outputs the difference signal. The microcomputer 14 adds the multiplied overflow signal of the A-D converting unit 1a to this difference signal, and displays the sum on the indicator 8 as a total measured signal. The part between T and Y on the curve B corresponds to the process in which the total input is decreasing to zero. In the process the input of the A-D converting unit 1a is reduced again to 1/N. The correspondence between each part or point on the curve B and each step in the flow chart shown in FIG. 5 is as follows: Step 502 corresponds to the part between O (the origin of the graph) and P; Step 504 to Q, Step 508 to R, Steps 510 and 511 to the part between R and S; and Step 512 to the parts between S and T. For the A-D converting unit and D-A converting unit incorporated in this embodiment those described in the preceeding embodiment can, of course, be employed.

What is claimed:

1. An A-D converter for use in an electronic balance comprising:
   a pulse-modulating D-A converting unit which converts an input digital signal to an analog output signal;
   an analog subtracter which subtracts the analog output signal of said pulse-modulating D-A converting unit from the analog signal to be measured;
   a switching means for selecting either the full output signal of said analog subtracter or the signal reduced to one N-th of the same;
   an A-D converting unit which converts the analog output of said switching means to a digital signal;
   a digital memory which can store a digital signal whose value is predetermined in accordance to said signal reduced to one N-th;
   a digital adder which adds said signal reduced to one N-th; with the same multiplied by N, to the output of said A-D converting unit; and a leading means for leading said digital signal stored in said digital memory to the input terminals of said pulse modulating D-A converting unit.

2. An A-D converter for use in an electronic balance as defined in claim 1, wherein both said pulse-modulating D-A converting unit and said A-D converting unit are driven synchronously with each other by a common clock.

* * * * *